(12) United States Patent
Negishi

(10) Patent No.: US 8,420,169 B2
(45) Date of Patent: Apr. 16, 2013

(54) METHOD OF MANUFACTURING ORGANIC THIN FILM

(75) Inventor: Toshio Negishi, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 383 days.

(21) Appl. No.: 12/718,398

(22) Filed: Mar. 5, 2010

(65) Prior Publication Data

US 2010/0178424 A1 Jul. 15, 2010

Related U.S. Application Data

(63) Continuation of application No. PCT/JP2008/066150, filed on Sep. 8, 2008.

(30) Foreign Application Priority Data

| Sep. 10, 2007 | (JP) | 2007-234441 |
| Feb. 25, 2008 | (JP) | 2008-043481 |

(51) Int. Cl.
*C23C 16/00* (2006.01)

(52) U.S. Cl.
USPC ............... 427/255.23; 427/248.1; 427/255.6; 118/715; 118/726

(58) Field of Classification Search ............... 427/255.6, 427/248.1, 255.23; 118/715, 726
See application file for complete search history.

(56) References Cited

U.S. PATENT DOCUMENTS

| 2002/0009545 A1 | 1/2002 | Hayashi |
| 2003/0056720 A1 | 3/2003 | Dauelsberg |
| 2005/0011443 A1* | 1/2005 | Matsukaze et al. ........... 118/715 |
| 2006/0278166 A1 | 12/2006 | Yamoto |
| 2007/0054051 A1 | 3/2007 | Arai et al. |
| 2007/0098891 A1* | 5/2007 | Tyan et al. ................. 427/248.1 |

FOREIGN PATENT DOCUMENTS

| EP | 1 413 644 A2 | 4/2004 |
| JP | 10-330920 | 12/1998 |
| JP | 2001-308082 A1 | 11/2001 |
| JP | 2001-523768 A1 | 11/2001 |
| JP | 2003-147529 A1 | 5/2003 |

(Continued)

OTHER PUBLICATIONS

International Search Report for International Application No. PCT/JP2008/066150 dated Nov. 27, 2008.

(Continued)

*Primary Examiner* — Elizabeth Burkhart
(74) *Attorney, Agent, or Firm* — Kratz, Quintos & Hanson, LLP

(57) ABSTRACT

A thin film of a uniform film thickness is formed even without increasing the film deposition rate. The temperature of an evaporation device disposed in an evaporation chamber is raised in advance, and an organic material is dropped from a supply unit onto an evaporation surface of the evaporation device; and when the organic material is evaporated, a heated carrier gas is introduced into the evaporation chamber, and is mixed in the evaporation chamber and is introduced into a discharger. While a molecular flow is formed in the discharger in a case that only the organic material vapor is introduced into the discharger, the pressure within the discharger is raised due to the carrier gas, so that a viscous flow is formed and the mixed gas is filled in the discharger and is uniformly discharged. The organic material may be supplied by a small amount and the film deposition rate may not become too high.

11 Claims, 8 Drawing Sheets

FOREIGN PATENT DOCUMENTS

| | | |
|---|---|---|
| JP | 2003-525349 A1 | 8/2003 |
| JP | 2003-268552 A1 | 9/2003 |
| JP | 2004-204289 A1 | 7/2004 |
| JP | 2005-29885 A1 | 2/2005 |
| JP | 2006-111920 A1 | 4/2006 |
| JP | 2006-152326 A | 6/2006 |
| WO | WO 99/25894 A1 | 5/1999 |

OTHER PUBLICATIONS

Supplemental European Search Report dated Oct. 7, 2011 cited in European Patent Application No. 08830039.7.

* cited by examiner

METHOD OF MANUFACTURING ORGANIC THIN FILM

This application is a continuation application of International Application No. PCT/JP2008/066150, filed Sep. 8, 2008, which claims priority to Japan Patent Application Nos. 2007-234441, filed Sep. 10, 2007 and 2008-043481, filed Feb. 25, 2008. The entire disclosures of the prior applications are herein incorporated by reference in their entireties.

TECHNICAL FIELD

The present invention generally relates to a technique to form an organic thin film, and specifically relates to an organic material vapor generator to form an organic thin film, a film forming source having the organic material vapor generator, and a film forming apparatus having the film forming source.

BACKGROUND OF THE INVENTION

Organic EL elements are one of the most popular display elements in recent years for having excellent characteristics of high brightness and high response speed.

In a color display panel using organic EL elements, light-emitting regions that produce three different colors of red, green and blue are disposed on a glass substrate. The light-emitting regions are configured by laminating an anode electrode film of a metal thin film, a hole injection layer, a hole transport layer, a light-emitting layer, and an electron transport layer of organic thin films, and an electron injection layer and a cathode electrode film of metal thin films in this order to produce a color of red, green, blue, or auxiliary yellow depending on a color-producing reagent added into the light-emitting layer.

In order to form such an organic thin film, a discharger 101 of organic material vapor, as illustrated in a perspective view of FIG. 7, is used.

The discharger 101 has vapor discharge pipes 172 in the form of a pipe. The vapor discharge pipes 172 are connected, by a supply pipe 127, to a production unit 105 in which organic material vapor is generated. When organic material vapor is supplied from the production unit 105, the organic material vapor is discharged from discharge orifices 173 formed in a large number on the vapor discharge pipes 172 in a longitudinal direction thereof towards an object to be film-formed 107, and when the vapor reaches the object to be film-formed 107; an organic thin film is formed on the surface.

However, in the above discharger 101, the amount of the organic material vapor discharged from the discharge orifices 173 sometimes differs in a portion near and a portion far from the position connected to the production unit 105 within the vapor discharge pipes 172. Therefore, there is a problem of poor film thickness distribution in the organic thin film formed on the surface of the object to be film-formed 107.

Particularly when a large-scale substrate is the object to be film-formed, the object to be film-formed cannot be rotated, so that it is difficult to make the film thickness distribution uniform.

In FIG. 8, film thickness monitors 149$_F$, 149$_C$ and 149$_B$ are disposed at positions facing a base portion (Front) near the portion connected to the supply pipe 127 of the vapor discharge pipe 172, a center portion (Center) of the vapor discharge pipe 172, and an end portion (Back) of the vapor discharge pipe 172, respectively, the end portion (Back) of the vapor discharge pipe 172 being the farthest away from the portion connected to the supply pipe 127. Only organic material vapor is introduced into the vapor discharge pipe 172 without using a carrier gas, and film thickness ratios of thin films formed at each of the positions are obtained by varying the film deposition rate.

The result is shown in Table 1 below. The film thickness of the center portion is expressed as "1".

TABLE 1

| Relationship between film deposition rate and film | | | |
|---|---|---|---|
| Film deposition | Film thickness ratio | | |
| ratio | Back | Center | Front |
| 1 Å/s | 0.77 | 1.0 | 1.39 |
| 7 Å/s | 0.88 | 1.0 | 1.08 |
| 15 Å/s | 0.98 | 1.0 | 1.01 |

A graph of the film thickness distribution corresponding to Table 1 above is drawn at a position above the vapor discharge pipe 172 in FIG. 8. In FIG. 8, L is a horizontal axis that indicates the film thickness ratio "1".

It is found that, as the film deposition rate is low (that is, as the level of the molecular flow is intensified), the film thickness ratio at the base portion becomes large.

At the film deposition rate of 15 Å/second, the film is formed generally uniformly. However, at the film deposition rate of 15 Å/second, it is difficult to control each film thickness within a desired range because it is excessively fast. At a film deposition rate greater than 7 Å/second, the formed film is prone to be nondense and a dense organic film may not be obtained. Accordingly, the film deposition rate for such an organic film is set to 7 Å/second or less, preferably from 3 Å/second to 5 Å/second.

Conventional arts that form an organic thin film using a carrier gas are shown in the following documents:
[Patent Document 1] JP 2001-523768 T,
[Patent Document 2] JP 2003-525349 T,
[Patent Document 3] JP 2004-204289 A,
[Patent Document 4] JP 2005-29885 A, and
[Patent Document 5] JP 2006-111920 A.

SUMMARY OF THE INVENTION

The present invention provides a technique that can form a uniform thin film even on a large-scale substrate.

The present invention is directed to a method of manufacturing an organic thin film having the steps of an organic material supply step of supplying an organic material to an evaporation chamber connected to a vapor discharge pipe by a supply pipe, an organic material evaporation step of evaporating the organic material supplied to the evaporation chamber by heating, an organic material vapor introduction step of introducing generated organic material vapor into a vapor discharge pipe by having it flow in the supply pipe, and an organic thin film formation step of discharging it through a discharge orifice provided in the vapor discharge pipe, reaching a surface of an object to be film-formed and forming an organic thin film on the surface of the object to be film-formed. A carrier gas is introduced into the evaporation chamber in the organic material evaporation step, and the carrier gas and the organic material vapor are introduced into the vapor discharge pipe in the organic material vapor introduction step.

The present invention is also directed to the method of manufacturing an organic thin film, wherein, in the organic material evaporation step, an evaporation device disposed in the evaporation chamber is heated, the organic material in powder form disposed in a supply unit from the supply unit is supplied to an evaporation surface of the evaporation device, and the organic material vapor is generated.

The present invention is also directed to the method of manufacturing an organic thin film, which is an organic thin film forming method of forming an organic thin film on one substrate by generating the organic material vapor from the organic material, wherein, in the organic material evaporation step, the organic material is continuously or intermittently supplied onto the evaporation surface while introducing the heated carrier gas into the evaporation chamber.

The present invention is also directed to the method of manufacturing an organic thin film, wherein the evaporation surface is inclined from a horizontal direction so that the organic material supplied onto the evaporation surface evaporates while sliding down on the evaporation surface; and, in the organic material evaporation step, a supply speed of the organic material to the evaporation surface is set at a magnitude such that the organic material on the evaporation surface disappears before reaching a lower end of the evaporation surface.

The present invention is also directed to the method of manufacturing an organic thin film wherein, in the organic material evaporation step, the temperature of the carrier gas introduced into the evaporation chamber is raised to an evaporation temperature of the organic material vapor or higher and is thereafter introduced.

The present invention is also directed to the method of manufacturing an organic thin film, wherein the temperature of a porous heating filter is raised, and the temperature of the carrier gas is raised by having it flow through the heating filter.

The present invention is also directed to the method of manufacturing an organic thin film, wherein, in the organic material evaporation step, the organic material is supplied from the supply unit to the evaporation device so that a film deposition rate of the organic thin film be from 3 Å/second to 7 Å/second, and the carrier gas is introduced so that a discharge amount thereof from each of the discharge orifices formed on the vapor discharge pipe along a longitudinal direction thereof be generally uniform.

The present invention is also directed to the method of manufacturing an organic thin film, wherein, in the organic thin film formation step, a pressure between the vapor discharge pipe and the surface of the object to be film-formed is from $10^{-4}$ Pa to $10^{-2}$ Pa.

The present invention is also directed to the method of manufacturing an organic thin film, wherein, in the organic thin film formation step, a pressure in the vapor discharge pipe during film formation is from $10^{-1}$ Pa to $10^{2}$ Pa.

The present invention is also directed to the method of manufacturing an organic thin film, wherein a plurality of the vapor discharge pipes is arranged on an identical plane in parallel; and, in the organic thin film formation step, the substrate and the vapor discharge pipes are relatively moved in a direction perpendicular to an extending direction of the vapor discharge pipes without changing a distance between a plane on which a surface of the substrate is positioned and a plane on which the vapor discharge pipes are positioned.

The present invention is also directed to the method of manufacturing an organic thin film, which forms the organic thin film on a plurality of the objects to be film-formed on a substrate holder by sequentially disposing the objects to be film-formed on the substrate holder, wherein: in the organic material evaporation step, the object to be film-formed having the organic thin film formed thereon on the substrate holder is moved while flowing the carrier gas after stopping supply of the organic material to the evaporation chamber, the unformed object to be film-formed is disposed on the substrate holder, and thereafter, supply of the organic material to the evaporation chamber is restarted.

The present invention is also directed to the method of manufacturing an organic thin film, wherein an organic base material of an organic thin film emitting light in a predetermined color and an organic color-producing reagent are mixed with each other in order to form the organic material; and the organic material is evaporated in the evaporation chamber.

The present invention is configured as described above; and when the organic material is dispersed on the inclined evaporation surface and is evaporated due to the heat transfer from the evaporation surface, the heated carrier gas is sprayed to the generated organic material vapor and the organic material vapor is carried in a state where the organic material vapor and the carrier gas are mixed. Thus, the mixed gas of the carrier gas and the organic material vapor is introduced into the vapor discharge pipe.

In the present invention, the pressure of the film forming chamber during the film formation is preferably from $10^{-4}$ Pa to $10^{-2}$ Pa. In order to obtain a good film quality, the pressure of the film forming chamber is preferably set such that the pressure of a mean free path becomes the interval between the discharge orifice and the substrate or more. The supply amount of the organic material is determined such that the film deposition rate is 7 Å/second or less. Preferably, the film deposition rate is from 3 Å/second to 5 Å/second. The supply amount of the carrier gas is determined such that the internal pressure of the vapor discharge pipe becomes a pressure of discharging the gas generally uniformly from the discharge orifices aligned longitudinally.

The evaporation chamber is heated to a temperature higher than the evaporation temperature such that a portion lower than the evaporation temperature of the organic material inside the evaporation chamber does not exist; and the supply pipe and the vapor discharge pipe are also heated to a temperature higher than the evaporation temperature, so that the organic material vapor does not precipitate until the organic material vapor is discharged from the vapor discharge pipe.

Since the organic material vapor is discharged in the same amount per unit of time from the base position through the end position of the elongate vapor discharge pipe, an organic thin film having a good film thickness distribution is formed.

Since the organic material vapor generated in the evaporation chamber is carried into the discharger by the carrier gas, the residual amount of the organic material vapor within the evaporation chamber is less; and as the supply of the organic material vapor is stopped, the film formation can be immediately stopped.

DETAILED DESCRIPTION OF THE INVENTION

A description is hereinafter provided for a method of manufacturing an organic thin film according to the present invention together with a vacuum processing apparatus that can perform the method of the present invention.

Figure 1:
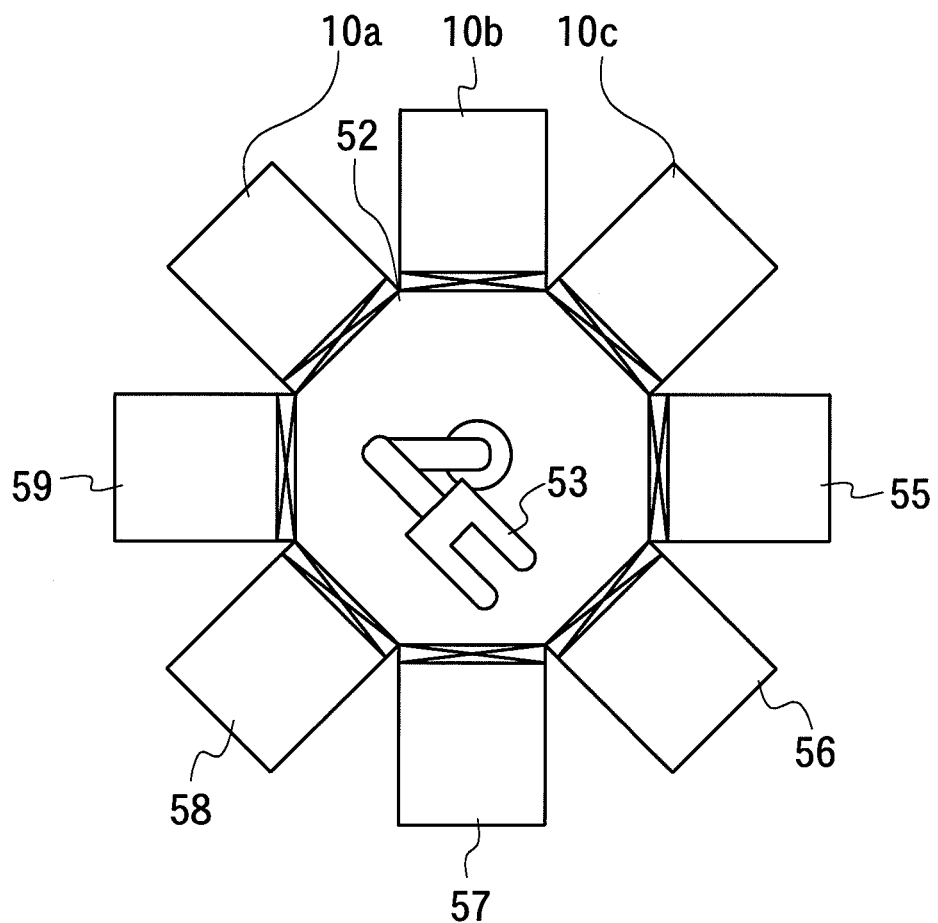
FIG. 1 illustrates one example of a vacuum processing apparatus applicable to the present invention.

A reference numeral 1 in FIG. 1 denotes the vacuum processing apparatus having film forming apparatuses 10a to 10c.

This vacuum processing apparatus 1 has a transfer chamber 52, to which the film forming apparatuses 10a, 10b and 10c corresponding to R, G and B, respectively, and other processing apparatuses 55 to 58 or a carry-in and out chamber 59 are connected.

Each chamber or each of the apparatuses 10a to 10c, 52, and 55 to 59 is respectively connected to a vacuum evacuator and the inside thereof is evacuated to a vacuum atmosphere.

Inside the transfer chamber 52, a substrate transfer robot 53 is disposed. The substrate transfer robot 53 carries in and out a substrate, as an object to be film-formed, between each chamber or each of the apparatuses 10a to 10c and 55 to 59 while maintaining the vacuum atmosphere.

Figure 2:
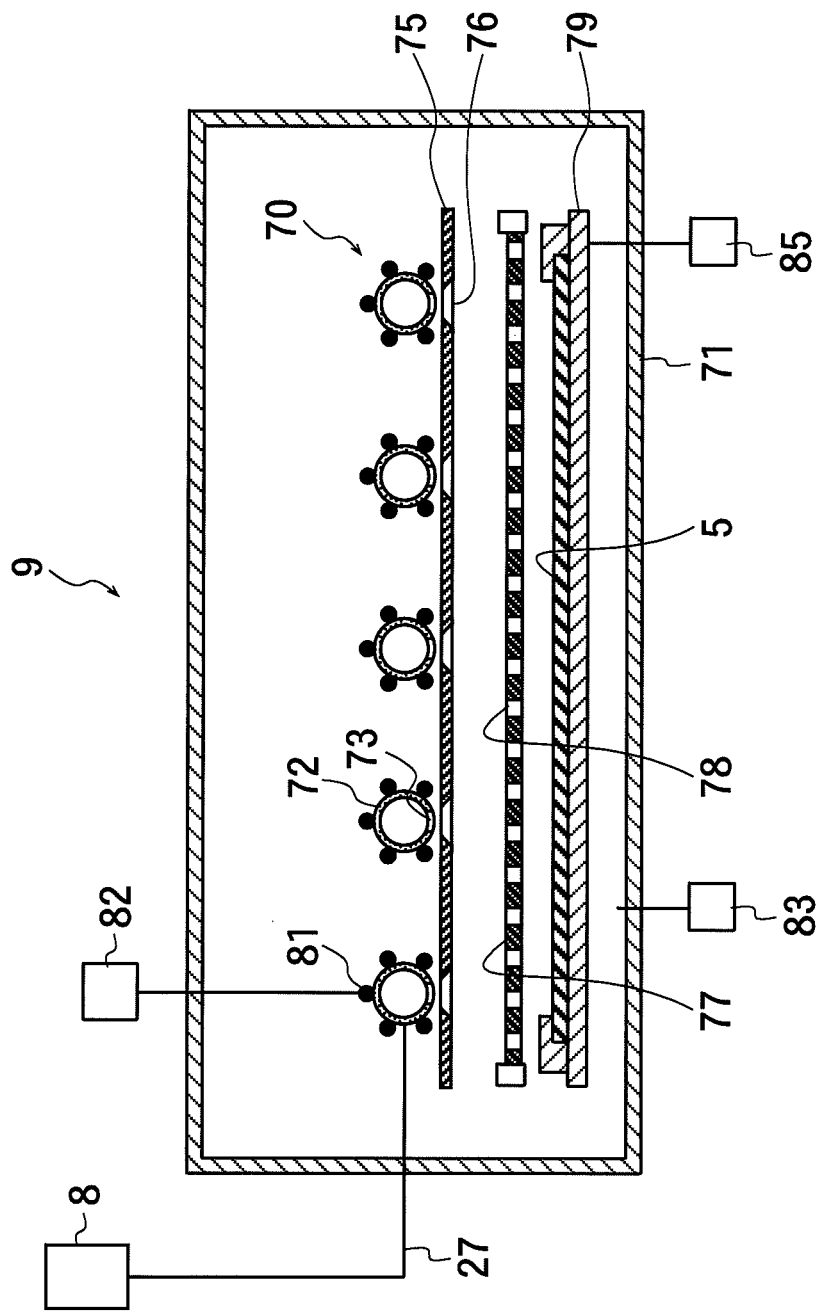
FIG. 2 is a diagram for illustrating a film forming chamber included in the vacuum processing apparatus.
Figure 3:
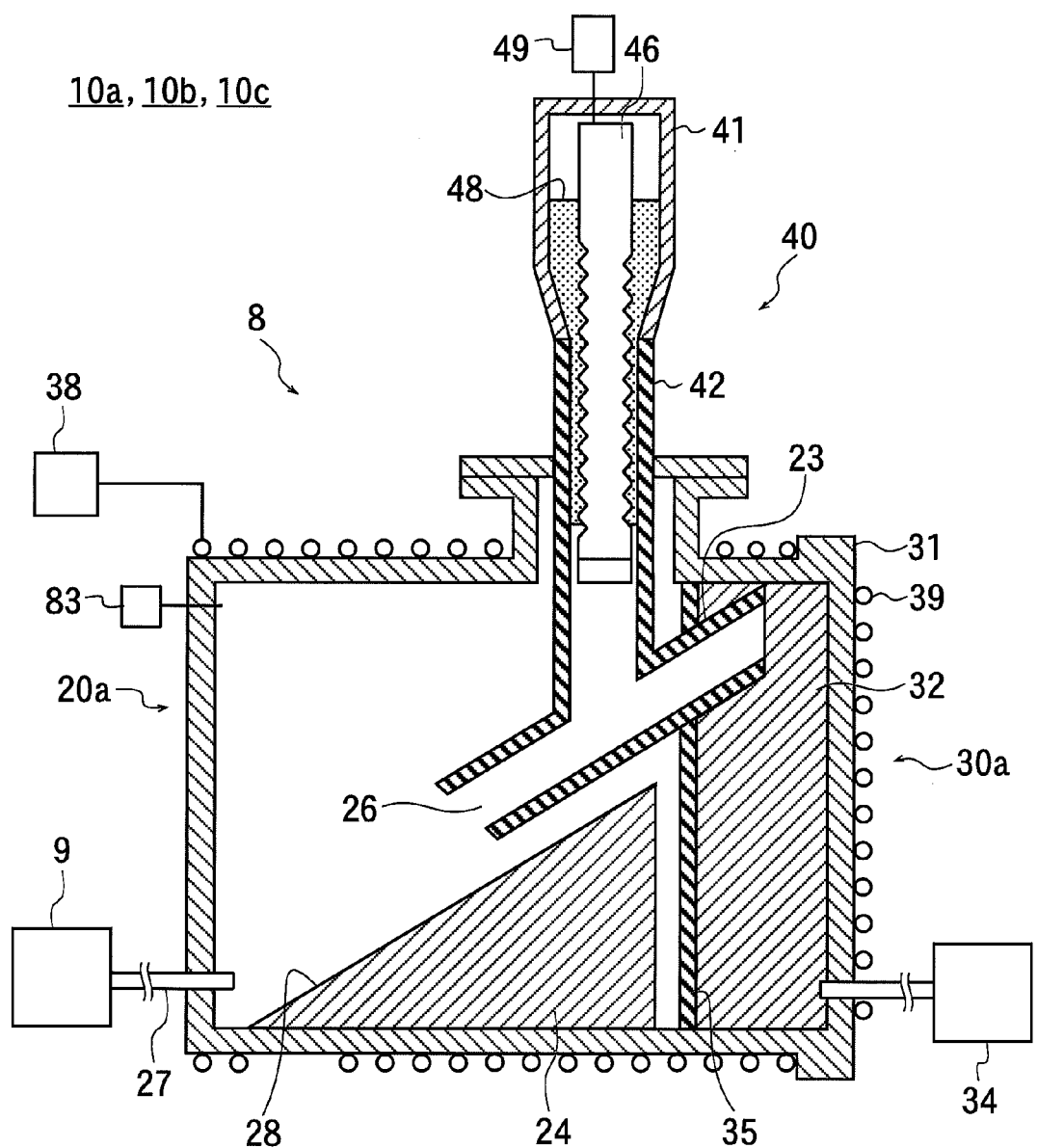
FIG. 3 is a diagram for illustrating an organic material vapor generator applicable to the present invention.

The three film forming apparatuses 10a to 10c have an identical apparatus configuration and the members in common are illustrated with the same reference numerals. Each of the film forming apparatuses 10a to 10c has, as illustrated in FIG. 2 and FIG. 3, an organic material vapor generator 8 and a film forming chamber 9. FIG. 2 illustrates the inside of the film forming chamber 9, while FIG. 3 illustrates the inside of the organic material vapor generator 8.

In reference to FIG. 2, a description will hereinafter be provided for the film forming chamber 9. The film forming chamber 9 has a vacuum chamber 71. A vacuum evacuation system 83 is connected to the vacuum chamber 71, inside of which is evacuated to a vacuum atmosphere by the vacuum evacuation system 83. During the film formation, the vacuum evacuation in the film forming chamber 9 is continuously performed.

Inside the vacuum chamber 71, a discharger 70 is disposed. This discharger 70 has a plurality of elongate vapor discharge pipes 72. Each vapor discharge pipe 72 is provided with a plurality of discharge orifices 73 along longitudinal directions thereof; and the inside of the vapor discharge pipe 72 is connected to an ambient atmosphere of the vapor discharge pipe 72 by the discharge orifices 73.

Figure 6:
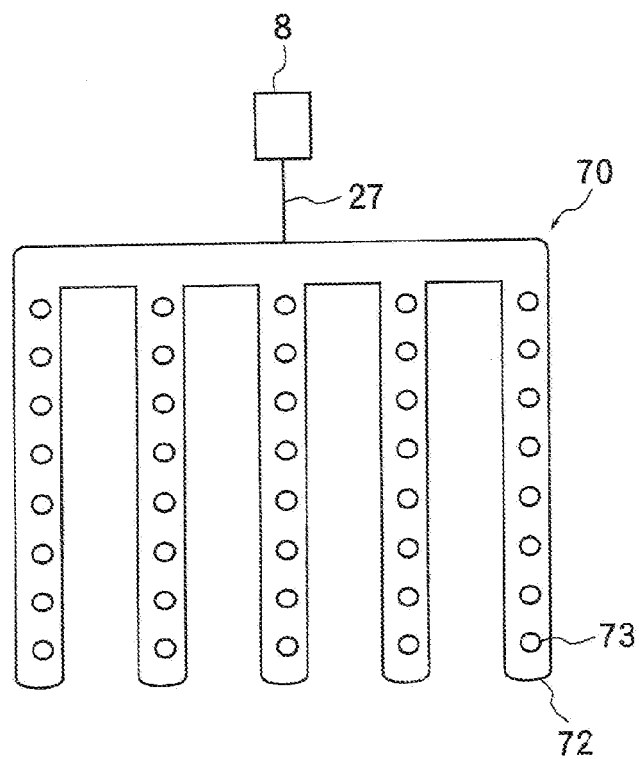
FIG. 6 is a diagram for illustrating a vapor discharge pipe.
Figure 7:
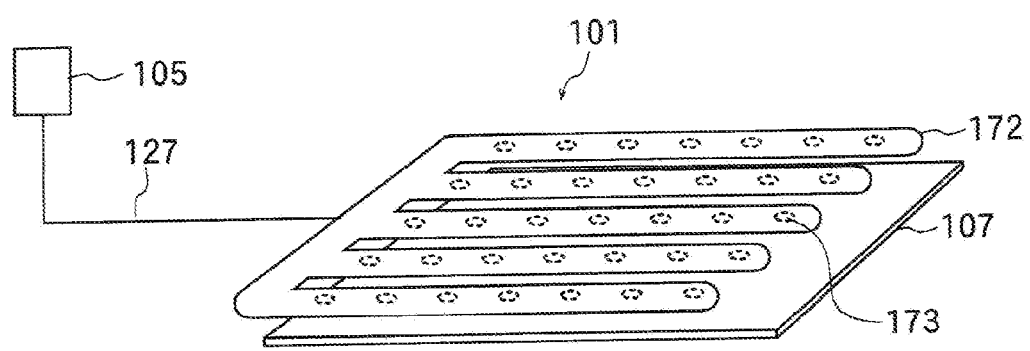
FIG. 7 is a diagram for illustrating a discharger of a background technique.
Figure 8:
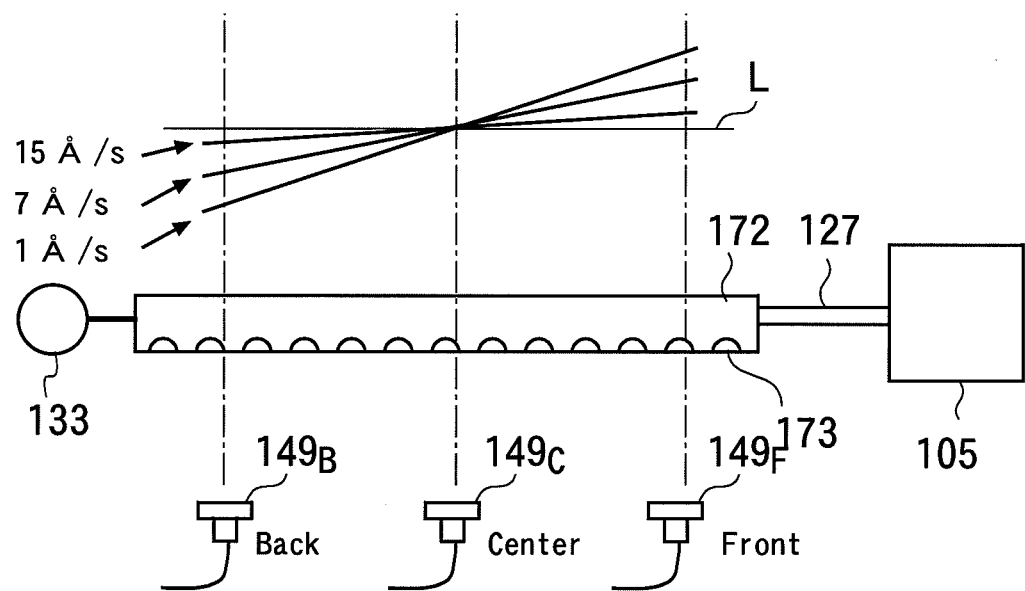
FIG. 8 is a chart for showing the relationship between a position of a vapor discharge pipe and a film deposition rate when a carrier gas is not used.

As illustrated in FIG. 6, each vapor discharge pipe 72 is disposed at equal intervals parallel to each other. Here, each vapor discharge pipe 72 is disposed so as to be positioned on an identical plane.

Each vapor discharge pipe 72 shares a common base portion; and a supply pipe 27 is connected to that portion. Each vapor discharge pipe 72 is connected to the organic material vapor generator 8 by the supply pipe 27; and as described later, organic material vapor generated in the organic material vapor generator 8 is introduced into the inside of each vapor discharge pipe 72 from the base portion thereof through the supply pipe 27.

Here, the end portion of each vapor discharge pipe 72 is blocked and the entire amount of the gas introduced into the vapor discharge pipe 72 is discharged from each discharge orifice 73 into the vacuum chamber 71 while flowing in each vapor discharge pipe 72. Although the discharge orifices 73 are of the same size in the present embodiment, the size thereof may also be varied for flow rate adjustment. The intervals between the discharge orifices 73 may also be varied.

Inside the vacuum chamber 71, a substrate holder 79 is disposed. On the substrate holder 79, a substrate 5 as an object to be film-formed is disposed.

A mask 77 is disposed over a surface of the substrate 5, and the discharger 70 is disposed above the mask 77 interposing a cooling plate 75 therebetween.

Here, the substrate 5 is horizontally disposed with the surface directed vertically above, and the discharger 70 is horizontally disposed vertically above the substrate 5. The cooling plate 75 and the mask 77 are horizontally disposed between the discharger 70 and the substrate 5 (the cooling plate 75 being disposed between the discharger 70 and the mask 77).

Each vapor discharge pipe 72 is provided with heaters 81 and the heaters 81 are electrified by a heating power source 82 to heat the vapor discharge pipe 72. So as not to heat the mask 77 due to the heat of the heaters 81, the cooling plate 75 is disposed between the discharger 70 and the mask 77.

The discharge orifices 73 of each vapor discharge pipe 72 are directed in a direction where the substrate 5 is positioned; and the discharge orifices 73 are disposed at positions in a grid pattern so as to correspond to the substrate 5 in a rectangular form. At positions of the cooling plate 75 directly facing the discharge orifices 73, passage holes 76 are provided and the gas discharged from the discharge orifices 73 reaches the mask 77 through the passage holes 76.

In the mask 77, through-holes 78 are disposed in a predetermined pattern; and of the gas that has reached the mask 77, the gas passing through the through-holes 78 reaches the substrate 5 so as to make contact with the surface of the substrate 5.

As described later, organic material vapor is contained in the gas discharged from the discharge orifices 73; and at positions of the surface of the substrate 5 directly facing the through-holes 78, an organic thin film corresponding to the pattern of the through-holes 78 is formed.

When a gas is discharged from the vapor discharge pipes 72, the vacuum chamber 71 is continuously vacuum-evacuated from before the discharge, and residual gases that are not necessary for configuring the organic thin film are removed from the vacuum chamber 71 by the vacuum evacuation.

Next, in reference to FIG. 3, a description will hereinafter be provided for an organic material vapor generator 8 of a first example of the present invention. The organic material vapor generator 8 has an evaporation chamber 20a that evaporates an organic material and a supply unit 40 that supplies the organic material to the evaporation chamber 20a.

Here, the organic material vapor generator 8 has a heating tank 31 with the inside partitioned into two sections with a partition 35, the evaporation chamber 20a being in one section, and a gas heating unit 30a being in the other section.

Although, in the diagram, the heating tank 31 is disposed outside the vacuum chamber 71, the heating tank 31 can also be disposed inside the vacuum chamber 71.

An evaporation device 24 is disposed inside the evaporation chamber 20a. This evaporation device 24 is formed of a metal and an evaporation surface 28, which is a top surface of the evaporation device 24, is made smooth and inclined at an angle θ relative to the horizontal direction (0 <θ<90°).

A heating filter 32 is disposed inside the gas heating unit 30a. This heating filter 32 is configured with porous SiC, net-shape SiC, a laminate of metal net, or another material that is permeable to the gas and is not decomposed or does not discharge gas even when the temperature is raised to high temperatures.

A heater 39 is disposed on side faces, a bottom face, and a surface of the heating tank 31, and is configured so as to raise the temperature of the heating tank 31 as the heater 39 is electrified by the heating power source 38 to generate heat. The heating filter 32 and the evaporation device 24 are heated by the heat transfer and the radiation heat from the heating tank 31. Induction heating coils may also be disposed outside the heating tank 31 for induction heating of the heating filter 32 and the evaporation device 24 with alternating magnetic fields.

A connection pipe 23 is disposed inside the heating tank 31 across the gas heating unit 30a and the evaporation chamber 20a. The partition 35 is made of a material that does not allow gas to pass therethrough; and one end of the connection pipe 23 is opened in the evaporation chamber 20a and the other end is opened in the gas heating unit 30a; thus, the gas heating unit 30a and the evaporation chamber 20a are connected to each other by the connection pipe 23 and the gas within the gas heating unit 30a can move to the evaporation chamber 20a through the connection pipe 23.

The evaporation chamber 20a is connected to the above-described vacuum evacuation system 83, and as the evaporation chamber 20a is vacuum-evacuated, the gas within the gas heating unit 30a is also vacuum-evacuated via the connection pipe 23 and the insides of the evaporation chamber 20a and the gas heating unit 30a can be made to be at a vacuum atmosphere. During the vapor generation, however, the evaporation chamber 20a and the vacuum evacuation system 83 are blocked so as not to evacuate the generated vapor.

A carrier gas supply system 34 is connected to the gas heating unit 30a. From the carrier gas supply system 34, a carrier gas is supplied which is composed of a noble gas (such as Ar and Xe), which does not react with the organic material. (In a case where the organic material vapor reacts with a nitrogen gas, the nitrogen gas is not suitable for the carrier gas.) As the carrier gas is supplied from the carrier gas supply system 34 to the gas heating unit 30a, the carrier gas enters the inside of the connection pipe 23 through the pores and the mesh of the heating filter 32, and flows in the connection pipe 23 and is introduced into the evaporation chamber 20a.

The heating filter 32 is heated by the heater 39; and the carrier gas is heated to a temperature higher than the evaporation temperature of the organic material, and lower than the decomposition temperature thereof while passing through the heating filter 32.

The supply unit 40 has a tank chamber 41 and a raw material supply pipe 42; and the tank chamber 41 is disposed above the evaporation chamber 20a.

The raw material supply pipe 42 has an upper end air-tightly connected to a lower end of the tank chamber 41, and has a lower end air-tightly inserted inside the evaporation chamber 20a. The inside of the tank chamber 41 and the inside of the evaporation chamber 20a are connected to each other by the raw material supply pipe 42; and as the inside of the evaporation chamber 20a is vacuum-evacuated, the inside of the tank chamber 41 and the inside of the raw material supply pipe 42 are also vacuum-evacuated.

The tank chamber 41 is sealed, and the atmosphere does not enter while the tank chamber 41, the raw material supply pipe 42, and the evaporation chamber 20a are vacuum-evacuated.

Inside the raw material supply pipe 42, a rotary shaft 46 is disposed therein with the side face having screw threads and screw grooves formed thereon. Here, the raw material supply pipe 42 and the rotary shaft 46 are vertically disposed.

The screw threads of the rotary shaft 46 and the inner wall surface of the raw material supply pipe 42 make contact with or are adjacent with a slight gap to each other; and the inside of the tank chamber 41 is connected to the evaporation chamber 20a by the screw grooves. The inclination angle of the screw grooves relative to the horizontal direction is small; and in a stationary state of the rotary shaft 46, even when powder smaller than the size of the screw grooves is disposed inside the tank chamber 41, it does not fall down into the evaporation chamber 20a.

Inside the tank chamber 41, the organic material in powder form is disposed in which the base material of the organic thin film and a color-producing reagent are mixed. In the tank chambers 41 of the three film forming apparatuses 10a to 10c, an organic material is respectively disposed such that it respectively emits light in each color of R, G and B. A reference numeral 48 in the diagram denotes the organic material disposed in the tank chamber 41.

Although the organic material 48 in the tank chamber 41 does not move in a stationary state of the rotary shaft 46, when the rotary shaft 46 is rotated by activating a rotary driver (motor 49) connected to the rotary shaft 46, the organic material 48 enters inside the raw material supply pipe 42 through the screw grooves and moves below along the screw grooves of the raw material supply pipe 42.

The raw material supply pipe 42 is configured such that its lower end is inserted inside the evaporation chamber 20a and connected to the connection pipe 23, and the inside of the raw material supply pipe 42 and the inside of the connection pipe 23 communicate with each other.

The lower end of the screw grooves is opened in the raw material supply pipe 42, and the organic material having reached the lower end of the screw grooves by moving below due to the rotation of the rotary shaft 46 drops onto the inner circumference face of the connection pipe 23 from within the screw grooves.

When the rotary shaft 46 is slowly rotated, the amount of movement of the organic material within the screw grooves and the amount of rotation of the rotary shaft 46 are in one to one relationship; and if the relationship between the amount of rotation and the amount of drop is obtained in advance, it becomes possible to drop the organic material in a desired amount from the raw material supply pipe 42. When it is rotated slowly, it is possible to continuously drop the organic material by a small amount.

The connection pipe 23 is configured such that the portion between the end position in the evaporation chamber 20a and the position at which the organic material is dropped is tilted and an opening 26 at the end of the connection pipe 23 is even below the drop position. Consequently, the organic material having dropped onto the inner circumference face of the connection pipe 23 slides down towards the opening 26 on the inner circumference face of the connection pipe 23.

The opening 26 is disposed immediately above the evaporation surface 28 of the evaporation device 24, and the organic material having reached the opening 26 drops onto the evaporation surface 28 from the opening 26.

The organic material having dropped onto the evaporation surface 28 is dispersed on the evaporation surface 28. Since the evaporation surface 28 is tilted, the organic material slides down onto the evaporation surface 28 in a spread state.

Although the organic material that drops onto the evaporation surface 28 is in powder form at room temperature, the organic material evaporates when heated to the evaporation temperature or higher, and organic material vapor is generated. The evaporation device 24 is raised to a temperature higher than the evaporation temperature of the organic material by the heater 39 in advance. Further, since the organic material is supplied on the evaporation surface 28 in an amount that is allowed to be completely evaporated before the organic material slides down the evaporation surface 28 and reaches the lower end thereof (that is, while sliding down), the organic material starts evaporation immediately after being dispersed on the evaporation surface 28, evaporates while sliding down, and disappears from the evaporation surface 28 without reaching the lower end thereof.

When the organic material is dropped onto the evaporation surface 28, the vacuum evacuation in the vacuum chamber 71 is performed while the valve between the evaporation chamber 20a and the vacuum evacuation system 83 is closed so as not to vacuum-evacuate the organic material vapor generated in the evaporation chamber 20a by the evaporation of the organic material without passing through the discharger 70.

The evaporation chamber 20a and the discharger 70 are connected to each other by the supply pipe 27. When the organic material is dropped onto the evaporation surface 28, the carrier gas is supplied to the gas heating unit 30a, prior to the dropping of the organic material so as to allow the heated carrier gas to be introduced into the evaporation chamber 20a.

As the opening 26 of the connection pipe 23 in which the heated carrier gas flows is directed to the portion of the evaporation surface 28 where the organic material evaporates and the heated carrier gas is sprayed to that portion, the organic material vapor and the heated carrier gas are uniformly mixed in the evaporation chamber 20a; and the mixed gas is introduced into the vapor discharge pipes 72 through the supply pipe 27.

By controlling the flow rate of the carrier gas supplied from the carrier gas supply system 34 to the gas heating unit 30a, the internal pressure of the vapor discharge pipes 72 is set at a magnitude for forming a viscous flow of the mixed gas (mixed gas of the carrier gas and the organic material vapor) inside the vapor discharge pipes 72, and the inside of each vapor discharge pipe 72 is filled with the mixed gas of an approximately equal pressure from the base through the end. The inside of the vacuum chamber 71 is continuously vacuum-evacuated directly, and the ambient pressure of the vapor discharge pipes 72 is lower than the internal pressure of the vapor discharge pipes 72. As a result, the mixed gas is discharged from each discharge orifice 73 at an equal flow rate, and the organic material vapor reaches the surface of the substrate 5 at a uniform density per unit area through the passage holes 76 of the cooling plate 75 and the through-holes 78 of the mask 77.

By introducing the carrier gas, even in a case where the organic material vapor is introduced in a small amount, the pressure within the vapor discharge pipes 72 can be at a pressure possible to uniformly discharge vapor through the discharge orifices 73 between the end and the base portion.

Also in a case that the generation amount of the organic material vapor is changed, by changing the introduction amount of the carrier gas, it becomes possible to adjust the pressure within the vapor discharge pipes 72. Accordingly, it becomes possible to vary the generation amount of organic material vapor (that is, to adjust the film deposition rate).

According to the present invention, since the organic material vapor reaches the surface of the substrate in an equal amount from the base through the end of each vapor discharge pipe 72, an organic thin film without unevenness can be obtained.

Further, the film forming chamber 9 is provided with a shifter 85. While the substrate holder 79, the substrate 5, and the mask 77 are relatively stationary, and the discharger 70 and the cooling plate 75 are relatively stationary, the substrate 5 and each vapor discharge pipe 72 are configured to relatively move by the shifter 85.

The directions of movement of the shifter 85 are directions perpendicular to the extending directions of the vapor discharge pipes 72 without changing the distance between the plane where the substrate 5 is positioned and the plane where the vapor discharge pipes 72 are positioned. As the relatively reciprocating movement is repeated in such directions, a uniform organic thin film is formed on the surface of the substrate 5.

The relative movement of the shifter 85 may also be arranged such that the substrate 5 (and the substrate holder 79 and the mask 77) is stationary relative to the vacuum chamber 71 and the discharger 70 (and the cooling plate 75) moves relative to the vacuum chamber 71. It may also be in such a way that the discharger 70 is stationary relative to the vacuum chamber 71 and the substrate 5 moves relative to the vacuum chamber 71. Both the substrate 5 and the discharger 70 may also be arranged to move.

Further, the directions of relative movement may also have, in addition to the component in a direction perpendicular to the extending directions of the vapor discharge pipes 72, a component parallel to that and may also be arranged to relatively move in a circle.

As described above, after forming the organic thin film that emits in one of the colors of R, G and B at a predetermined position on the substrate 5 in the first film forming apparatus 10a, the substrate 5 is first moved into the next film forming apparatuses 10b and 10c sequentially by the substrate transfer robot 53 to form organic thin films corresponding to the rest of the colors respectively at predetermined positions on the substrate 5 and to be carried in other processing chambers 55 to 58, if needed, for vacuum processing (such as, formation of charge transfer layers and electrode films); and then, the substrate is carried out of the vacuum processing apparatus 1.

In the present invention, the heating tank 31 and the carrier gas are raised to a temperature higher than the evaporation temperature of the organic material (here, the evaporation temperature is assumed to be equal to the precipitation temperature) and the organic material vapor does not form at a temperature of the precipitation temperature or less, so that the organic material does not precipitate into the heating tank 31.

In the present invention, the organic material is supplied from the supply unit 40 into the evaporation chamber 20a at a supply speed such that the organic material dropped onto the evaporation surface 28 evaporates while sliding down the evaporation surface 28; and as the drop of the organic material onto the evaporation surface 28 is stopped, the organic material in powder form on the evaporation surface 28 immediately disappears. Consequently, the generation of the organic material vapor is also stopped almost at the same time when the supply of the organic material from the supply unit 40 to the evaporation chamber 20a is stopped.

Further, in the evaporation chamber 20a, the pressure of the heated carrier gas is arranged to be higher than the pressure of the generated organic material vapor, and as a result, a small amount of the organic material gas is carried into the discharger 70 with a large amount of the heated carrier gas flow, so that when the supply of the organic material from the supply unit 40 to the evaporation device 24 is stopped, the generation of the organic material vapor within the evaporation chamber 20a is immediately stopped. Further, the organic material vapor filling the evaporation chamber 20a immediately moves into the discharger 70 due to the heated carrier gas and is immediately discharged. Consequently, as the supply of the organic material from the supply unit 40 is stopped while the carrier gas is made to flow, the organic material vapor is quickly purged, so that the time until the film formation is stopped can be shortened. Also, the insides of the evaporation chamber 20a, the supply pipe 27, and the discharger 70 can be securely purged.

Figure 9:
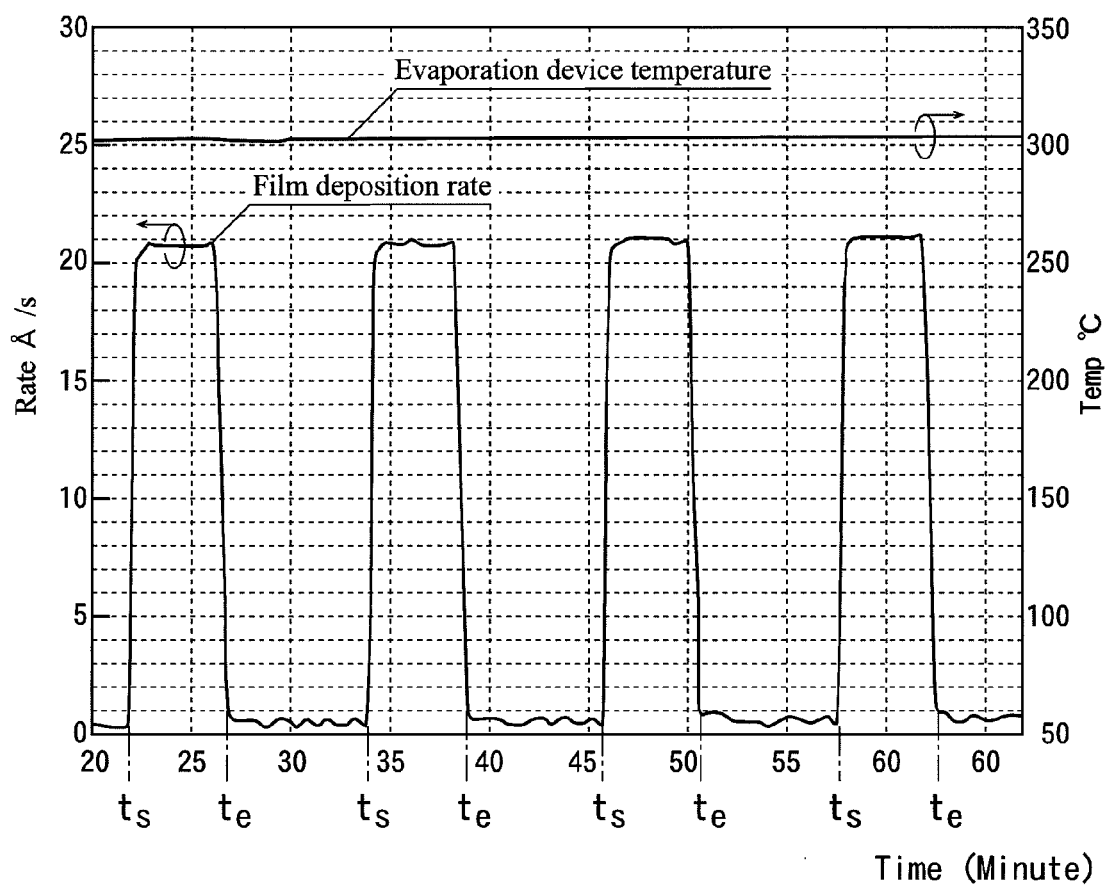
FIG. 9 is a graph for showing the relationship between a supply cycle of an organic material and a cycle of a film deposition rate.

FIG. 9 is a graph for showing the relationship between time and the measurements of the film thickness monitors disposed at the positions facing the vapor discharge pipe 72 when the organic material is dropped onto the evaporation device 24 at predetermined time intervals while maintaining the temperature of the evaporation device 24 at a constant temperature of about 300° C.

From a time $t_s$ when the supply of the organic material to the evaporation device 24 is started until a time $t_e$ when the supply is stopped, a constant film deposition rate is obtained; and from a time $t_e$ when the supply is stopped until a time $t_s$ when the supply is restarted, the raw material is not supplied and the film deposition rate is zero although error outputs of the film thickness monitors are observed.

In such a manner, since a thin film can be formed on the surface of the substrate 5 only during the supply of the organic material onto the evaporation device 24 while flowing the heated carrier gas from the gas heating unit 30a, it is not necessary to provide a shutter between the discharger 70 and the substrate 5 and also the discharge of the organic material vapor from the discharger 70 can be started or stopped without opening or closing the opening-closing valve between the evaporation chamber 20a and the discharger 70.

Inside each of the film forming apparatuses 10a, 10b and 10c, to form an organic thin film on a plurality of substrates 5 in order, while moving the object to be film-formed having an organic thin film formed thereon from the substrate holder 79 and disposing an unformed object to be film-formed on the substrate holder 79, the supply of the organic material from the supply unit 40 to the evaporation chamber 20a is stopped. After disposing the object to be film-formed before film formation on the substrate holder 79, the supply of the organic material from the supply unit 40 to the evaporation chamber 20a is restarted to start film formation.

If the heated carrier gas is made to continuously flow into the evaporation chamber 20a, the supply pipe 27, and the discharger 70 not only after the restart of the organic material supply but also between the replacement of the substrates and the restart of the organic material supply, the temperature of the heating filter is constantly maintained, so that the temperature of the mixed gas discharged from the discharger 70 also becomes constant and the film quality of the formed organic thin film becomes less varied.

Figure 4:
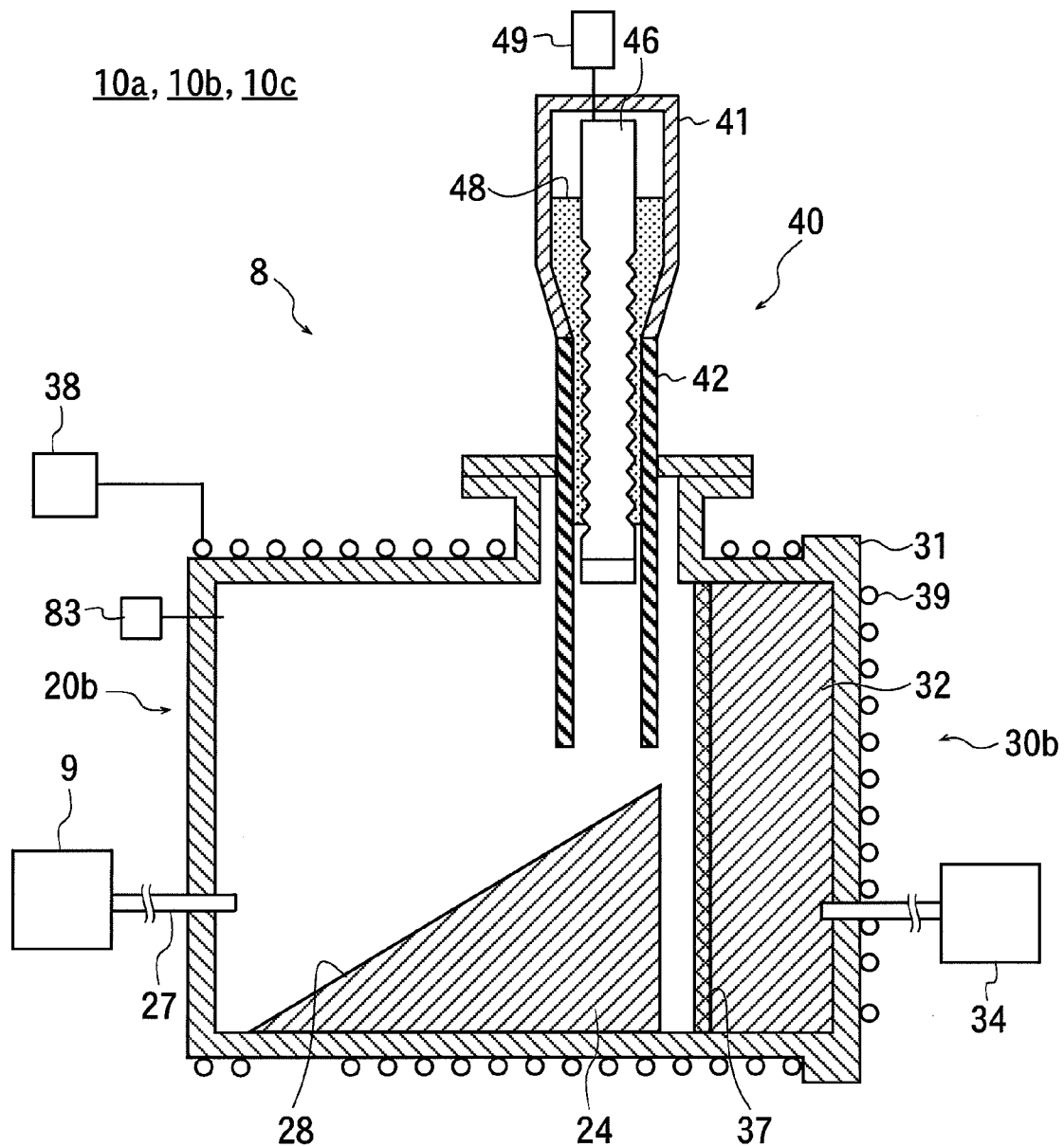
FIG. 4 is a diagram for illustrating another organic material vapor generator applicable to the present invention.

Although, in the above embodiment, the inside of the heating tank 31 is partitioned with the partition 35 that does not allow a gas to pass therethrough, the inside of the heating tank 31 may also be partitioned with an air permeable plate 37 that allows a gas to pass therethrough, as illustrated in FIG. 4, in order to form an evaporation chamber 20b and a gas heating unit 30b. The carrier gas, heated when passing through the heating filter 32 in the gas heating unit 30b, is introduced into the evaporation chamber 20b through the air permeable plate 37. In this case, a connection pipe that connects the evaporation chamber 20b and the gas heating unit 30b is not necessary, and as the evaporation device 24 is disposed immediately below the raw material supply pipe 42, the organic material can be dropped from the raw material supply pipe 42 onto the evaporation surface 28 without passing through the connection pipe.

Figure 5:
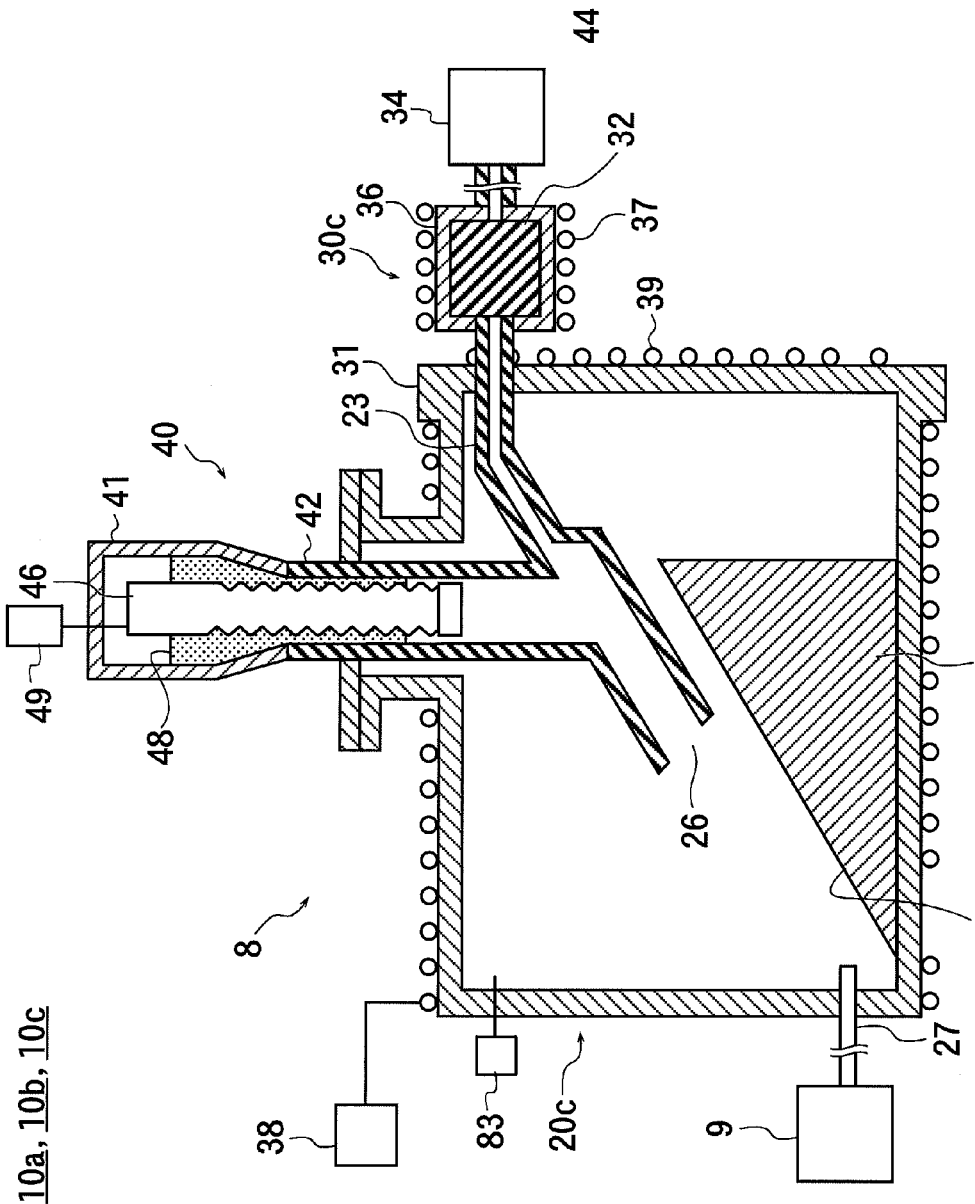
FIG. 5 is a diagram for illustrating another organic material vapor generator applicable to the present invention.

Although, in the above embodiment, the gas heating units 30a and 30b are disposed inside the heating tank 31, the present invention is not limited thereto. As illustrated in FIG. 5, a gas heating unit 30c can also be disposed outside the heating tank 31. In this case, the entire inside of the heating tank 31 may also be taken as an evaporation chamber 20c and the gas heating unit 30c and the evaporation chamber 20c may also be connected to each other by the connection pipe 23.

In this example, the lower end of the raw material supply pipe 42 can also be connected to the connection pipe 23 for allowing the organic material to drop from the raw material supply pipe 42, side down in the connection pipe 23, and drop it onto the evaporation surface 28.

As described above, in the present invention, the carrier gas is heated higher than the evaporation temperature of the organic material, so that the evaporation chamber 20a and the supply pipe 27 are not cooled down and the organic material vapor does not precipitate therein. It is also possible to dispose a heater on the outer circumference of the supply pipe 27 so as to heat the supply pipe 27.

Also, the heater, which heats the heating tank 31 and the supply pipe 27, heats the evaporation device 24, the supply pipe 27, and the carrier gas so as to raise the temperature lower than the decomposition temperature of the organic material, so that the organic material is not decomposed.

Although, in the above-described embodiments, the supply unit 40 has the raw material supply pipe 42, the rotary shaft 46 disposed therein, and the motor 49 for rotating the rotary shaft 46, the supply unit 40 is however not limited thereto. A supply unit that can supply a predetermined amount of the organic material on the evaporation surface 28 by a small amount may suffice.

It should be noted that, since the film thickness of an organic thin film formed on the surface of one substrate 5 is generally determined in advance and almost all the organic material vapor generated in the evaporation chamber 20a is discharged from the discharger 70, it is possible to obtain the amount of the organic material such that the supply unit 40 should supply for the formation of an organic thin film of a film thickness determined in advance.

Since, as the film deposition rate for an organic thin film is determined, the supply speed of the organic material that is supplied to the evaporation chamber 20a by the supply unit 40 is also determined, the rotation speed of the rotary shaft 46 is determined so as to obtain the supply speed.

The tank chamber 41 is not heated, the supply unit 40 is cooled down, and the organic material existing in the tank chamber 41 and the supply unit 40 is maintained at temperatures of approximately room temperature.

In the present invention, the organic material is supplied into the evaporation chamber 20a by a small amount, so that the organic material in the tank chamber 41 and the supply unit is maintained at temperatures of approximately room temperature and it is possible to prevent decomposition due to heating.

It should be noted that, although the carrier gas is heated by flowing the carrier gas into the porous or net-shaped heating filter at a raised temperature in the above-described embodiments, the temperature may also be raised by flowing the carrier gas into various heat exchangers.

In a case where the film thickness and the film deposition rate of the organic thin film to be formed are defined, the film forming time period and the supply speed (amount of supply per unit of time) can be obtained from the amount of the organic material obtained from the film thickness and the defined film deposition rate, so that the rotary shaft 46 can be continuously rotated during the film forming time period at a rotation speed calculated from the obtained supply speed, and the organic material can be dropped intermittently by intermittently rotating the rotary shaft 46 in a short cycle such that the organic material is supplied in the obtained amount within the film forming time period.

What is claimed is:

1. A method of manufacturing an organic thin film comprising the steps of:
   - an organic material supply step of supplying an organic material to an evaporation chamber connected to a vapor discharge pipe by a supply pipe;
   - an organic material evaporation step of evaporating the organic material supplied to the evaporation chamber by heating;
   - an organic material vapor introduction step of introducing generated organic material vapor into a vapor discharge pipe by flowing it in the supply pipe; and
   - an organic thin film formation step of discharging the generated organic material vapor through a discharge orifice provided in the vapor discharge pipe, reaching a surface of an object to be film-formed and forming an organic thin film on the surface of the object to be film-formed,
   - wherein a carrier gas is introduced into the evaporation chamber in the organic material evaporation step, and the carrier gas and the organic material vapor are introduced into the vapor discharge pipe in the organic material vapor introduction step, wherein
   - in the organic material evaporation step, an evaporation device disposed in the evaporation chamber is heated,
   - the organic material in powder form disposed in a supply is supplied from the supply unit to an evaporation surface of the evaporation device and the organic material vapor is generated, and
   - the evaporation surface is inclined from a horizontal direction.

2. The method of manufacturing an organic thin film according to claim 1, which is an organic thin film forming method of forming an organic thin film on one substrate by generating the organic material vapor from the organic material, wherein, in the organic material evaporation step, the organic material is continuously or intermittently supplied onto the evaporation surface while introducing the carrier gas, which is heated, into the evaporation chamber.

3. The method of manufacturing an organic thin film according to claim 2, wherein the evaporation surface is inclined from a horizontal direction so that the organic material supplied onto the evaporation surface evaporates while sliding down on the evaporation surface, and, in the organic material evaporation step, a supply speed of the organic material to the evaporation surface is set at a magnitude such that the organic material on the evaporation surface disappears before reaching a lower end of the evaporation surface.

4. The method of manufacturing an organic thin film according to claim 1, wherein, in the organic material evaporation step, the temperature of the carrier gas introduced into the evaporation chamber is raised to an evaporation temperature of the organic material vapor or higher.

5. The method of manufacturing an organic thin film according to claim 4, wherein the temperature of a porous heating filter is raised and the temperature of the carrier gas is raised by flowing it through the heating filter.

6. The method of manufacturing an organic thin film according to claim 1, wherein, in the organic material evaporation step, the organic material is supplied from the supply unit to the evaporation device so that a film deposition rate of the organic thin film be from 3 Å/second to 7 Å/second, and the carrier gas is introduced so that a discharge amount thereof from each of the discharge orifices formed on the vapor discharge pipe along a longitudinal direction thereof be generally uniform.

7. The method of manufacturing an organic thin film according to claim 1, wherein, in the organic thin film formation step, a pressure between the vapor discharge pipe and the surface of the object to be film-formed is from $10^{-4}$ Pa to $10^{-2}$ Pa.

8. The method of manufacturing an organic thin film according to claim 1, wherein, in the organic thin film formation step, a pressure in the vapor discharge pipe during film formation is from $10^{-1}$ Pa to $10^2$ Pa.

9. The method of manufacturing an organic thin film according to claim 1, wherein a plurality of the vapor discharge pipes is arranged on an identical plane in parallel, and, in the organic thin film formation step, the substrate and the vapor discharge pipes are relatively moved in a direction perpendicular to an extending direction of the vapor discharge pipes without changing a distance between a plane on which a surface of the substrate is positioned and a plane on which the vapor discharge pipes are positioned.

10. The method of manufacturing an organic thin film according to claim 1, which forms the organic thin film on a plurality of the objects to be film-formed on a substrate holder by sequentially disposing the objects to be film-formed on the substrate holder, wherein, in the organic material evaporation step, the object to be film-formed having the organic thin film formed thereon on the substrate holder is moved while flowing the carrier gas after stopping supply of the organic material to the evaporation chamber, the unformed object to be film-formed is disposed on the substrate holder, and thereafter supply of the organic material to the evaporation chamber is restarted.

11. The method of manufacturing an organic thin film according to claim 1, wherein an organic base material of an organic thin film emitting light in a predetermined color and an organic color-producing reagent are mixed each other in order to form the organic material, and the organic material is evaporated in the evaporation chamber.

* * * * *